United States Patent
Soeda et al.

(10) Patent No.: US 6,583,583 B1
(45) Date of Patent: Jun. 24, 2003

(54) ORGANIC EL MATERIAL

(75) Inventors: Mahito Soeda, Kitakyushu (JP);
Hiroshi Miyazaki, Kitakyushu (JP);
Tohru Saito, Kitakyushu (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/069,023

(22) PCT Filed: Aug. 30, 2000

(86) PCT No.: PCT/JP00/05882
§ 371 (c)(1),
(2), (4) Date: Feb. 21, 2002

(87) PCT Pub. No.: WO01/18149
PCT Pub. Date: Mar. 15, 2001

(30) Foreign Application Priority Data

Sep. 2, 1999 (JP) .......................................... 11-248880

(51) Int. Cl.$^7$ ................................................ G09G 3/10
(52) U.S. Cl. ................................ 315/169.3; 315/169.1; 345/76; 345/77
(58) Field of Search .......................... 315/169.1, 169.3, 315/169.4; 313/112, 503, 504, 505; 345/63, 76, 77; 257/59, 72

(56) References Cited

U.S. PATENT DOCUMENTS

| | | | | |
|---|---|---|---|---|
| 5,093,698 A | * | 3/1992 | Egusa ........................ | 357/17 |
| 6,380,687 B1 | * | 4/2002 | Yamazaki ................ | 315/169.3 |
| 6,411,019 B1 | * | 6/2002 | Hofstra et al. .............. | 313/112 |
| 6,501,227 B1 | * | 12/2002 | Koyama .................. | 315/169.3 |

FOREIGN PATENT DOCUMENTS

| | | |
|---|---|---|
| JP | 2-16164 A | 1/1990 |
| JP | 09-194441 | 7/1997 |
| JP | 2823352 B2 | 9/1998 |
| JP | 2902745 B2 | 3/1999 |
| JP | 11-171801 A | 6/1999 |
| JP | 2000-93701 A | 4/2000 |

OTHER PUBLICATIONS

C. W. Tang et al., Appl. Phys. Lett., 51(12), Sep. 21, 1987, pp. 913–915.
K. Sano et al., J. Mater. Chem, 1992 2(7) 767–768.
Larsson et al., Acta Chem. Scand. 22 (1968) No. 4, 1067–0175.

* cited by examiner

Primary Examiner—Don Wong
Assistant Examiner—Jimmy T. Vu
(74) Attorney, Agent, or Firm—Birch, Stewart, Kolasch & Birch, LLP

(57) ABSTRACT

This invention relates to an organic aluminum complex manifesting excellent performance when used in an organic EL device and to a process for preparing said complex. The organic EL material of this invention comprises an organoaluminum complex which generates heat of 2 J/g or less In the range of 350–400° C. and absorbs heat of 70–120 j/g, in the range of 400–450° C., with the maximum of an endothermic peak being located near 420° C. on analysis by differential scanning calorimetry. The organic EL material can be obtained by refining the raw material (8-quinolinolato)aluminum by sublimation under reduced pressure of 20 Torr or less while maintaining the temperature in the sublimation zone above 300° C. and below 420° C. and the temperature in the product recovery zone above 100° C. and below 250° C.

8 Claims, 7 Drawing Sheets

ORGANIC EL MATERIAL

This application is the national phase under 35 U.S.C. §371 of PCT International Application No. PCT/JP00/05882 which has an International filing date of Aug. 30, 2000, which designated the United States of America.

FIELD OF TECHNOLOGY

This invention relates to novel tris(8-quinolinolato) aluminum which is useful as a constituent of organic EL materials gaining importance in the manufacture of flat panel displays and to a process for refining said compound.

BACKGROUND TECHNOLOGY

An organic electroluminescent device (hereinafter referred to as an organic EL device) is constructed of layers of organic compounds comprising a layer of a luminescent material and a pair of electrodes holding the layers of organic compounds in between and, concretely, the basic construction is anode/organic luminescent layer/cathode and modifications of this construction by suitable addition of a hole injecting layer and an electron injecting layer are known. As for a material useful for an organic luminescent layer (hereinafter referred to as an organic EL material), a representative among known examples is tris(8-quinolinolato)aluminum (hereinafter referred to as Alq3) reported in Appl. Phys. Lett., 51, 913 (1987) by C. V. Tang, S. A. VanSlyke and others of Eastman Kodak Company. Substituted 8-quinolinol-aluminum complexes and 8-quinolinol-oxoaluminum complexes are also known. Since the compound in question is a complex, it is sometimes called tris(8-quinolinolato)aluminum complex or simply complex.

Intensive studies in recent years have raised the practical status of organic EL devices and, in the meanwhile, it has been suspected that the purity of organic compounds constituting the luminescent layer and the impurities contained in such organic compounds affect the basic properties such as luminous intensity and luminous efficiency and the life of organic EL devices. As for Alq3, for example, the essential quality requirements that Alq3 must satisfy are described in Japanese patent number 2902745 and 2823352, and a process for manufacturing Alq3 is described in Japanese patent publication JP11-171801A.

It is publicly known that Alq3 is a mixture of two isomers, facial and meridional, and a variety of analytical data are reported: for example, identification of two isomers by [1] H-AMR spectrometry in Anal. Chem., 1968, 40(13), 1945–51; mass spectra in Talanta, 1967(14), 1213–20; and infrared absorption spectra in Acta Chem. Scand., 1968, 22(4), 1067–75. However, virtually no report has been published on how the isomers affect the performance of organic EL devices on a quantitative basis.

Not much has been clarified either about the effects of trace impurities, crystal structure and steric structure; for example, it is not clear whether the positive presence of trace impurities is beneficial or not and how much of what impurities if beneficial or what crystal structure is preferable. This state of affairs is essentially due to Alq3 being highly pure and the relationship between high-purity Alq3 and the mechanism of light emission being unclear.

A refining procedure based on sublimation is generally adopted to raise the purity of Alq3 to a level suitable for use as an organic EL material. It is questionable, however, whether or not the conventional process for refining by sublimation with the use of an electric furnace and a glass apparatus is able to raise the purity of Alq3 to a satisfactory level for use as an organic EL material. A number of points still remain unclarified regarding the practically important relationship between, the performance of an organic EL device and factors such as the purity of organic EL materials and the kind and quantity of impurities and some of the points conceivably originate in the aforementioned refining technique. Constructional improvement of EL devices is said to have enhanced their basic performance to a level adequate for practical use today and, with the aim of commercial manufacture of Alq3 in view, there is also a demand for development of a technique for refining Alq3 by sublimation suitable for practical use. Moreover, development of analytical and manufacturing techniques for Alq3 as an organic EL material has become an important theme.

An object of this invention is to provide Alq3 which performs excellently as a material for an organic EL device and to provide a process for preparing said Alq3.

DISCLOSURE OF THE INVENTION

This invention relates to an organic EL material comprising tris(8-quinolinolato)aluminum complex which is characterized by generating heat of 2 J/g or less in the range of 350–400° C. and absorbing heat of 70–120 J/g in the range of 400–450° C. with the maximum of an endothermic peak being located near 420° C. on analysis by differential scanning calorimetry in a stream of nitrogen. This invention also relates to said organic EL material comprising tris(8-quinolinolato)aluminum complex which shows no peak at 418±2 $cm^{-1}$ and a peak at 423±2 $cm^{-1}$ in the infrared absorption spectrum measured by FT-IR Furthermore, this invention relates to a process for refining tris(8-quinolinolato)aluminum for an organic EL material which comprises refining raw material tris(8-quinolinolato)aluminum by sublimation at a reduced pressure of 10 Torr or less while keeping the temperature in the sublimation zone above 300° C. and below 420° C. and the temperature in the principal zone of the product recovery zone above 100° C. and below 250° C. Still more, this invention relates to a process for refining said tris(8-quinolinolato)aluminum for an organic EL material wherein the apparatus for refining by sublimation comprises the sublimation zone and the recovery zone including the product recovery zone and at least the temperature in the principal zone of the product recovery zone is controlled within ±10° C. of the set temperature.

Also, in an organic EL device comprising layers of glass substrate/transparent electrode/hole transporting layer/ luminescent layer/electrode or at least layers of glass substrate/transparent electrode/hole injecting layer/hole transporting layer/luminescent layer/electron transporting layer/electrode, this invention relates to an organic EL device wherein Alq3 to be incorporated in the luminescent layer and/or the electron transporting layer is said organic EL material or Alq3 that has been refined by said process for refining tris(8-quinolinolato)aluminum for an organic EL material.

The present inventors have conducted a variety of chemical and physical analyses to understand the quality of Alq3 which exerts a marked influence on the performance of an organic EL device and found that, apart from the aforementioned spectral data (IR, $^1$H-NMR and so on) reported so far, the results of thermal analysis are related to the performance of an organic EL device. The present inventors analyzed both Alq3 refined conventionally by sublimation (hereinafter referred to as conventional substance) and Alq3 refined by sublimation with the use of an original apparatus of their own development (hereinafter referred to as novel substance) by spectrometric techniques such as IR, $^1$H-NMR, mass, UV and fluorescence and by differential thermal analysis and differential scanning calorimetry and investigated the correlation of the analytical results with the basic performance of an organic EL device comprising ITO/hole transporting layer (TPD)/electron transporting layer (Alq3)/Al.Li electrode.

Comparison of the FT-IR (Fourier transform infrared spectrometry) spectra of the conventional and novel substances showed a difference on the order of 3–5 cm$^{-1}$ at some of the absorption peaks. It is said in FT-IR spectrometry that a difference greater than the resolving power of the apparatus (it is set at 2 cm$^{-1}$ here) is significant. However, it is fairly difficult to explain quantitatively slight structural changes (intramolecular and intermolecular) of the complex on the basis of the aforementioned differences in the FT-IR spectra. One reason for it is the extreme difficulty in preparing or isolating only one of the two isomers. Moreover, no well-defined differences were recognized between the conventional and novel substances in the spectra determined by UV, fluorescence, mass and $^1$H-NMR (400 MHz).

Distinct differences were recognized, however, between the two substances in differential scanning calorimetry (DSC) and differential thermal analysis (DTA). On analysis by DSC, the conventional substance showed an exothermic peak of 5–15 J/g in the range of 350–400° C. and a large endothermic peak of 60–90 J/g in the range of 400–450° C. with the maximum of the endothermic peak being located at 417–421° C. On the other hand, the novel substance showed virtually no exothermic peak or substantially no heat generation in the range of 350–400° C. while it showed a large endothermic peak of 70–120 J/g in general, preferably 70–100 J/g, more preferably 80–100 J/g, in the range of 400–450° C. with the maximum of the endothermic peak being located near 420° C. Moreover, on analysis by DTA, the conventional substance was observed to show a small exothermic peak near 380° C. and a large endothermic peak near 420° C. However, it was easier to use the DSC data in reviewing the results.

Organic EL devices with the construction of ITO/TPD/Alq3/Al.Li were prepared from the novel and conventional substances showing the aforementioned differences in thermal analysis and the luminance which is an index of the performance of a device was compared. It was confirmed, as a result, that a device comprising the novel substance showed a higher initial luminance. This invention has been completed on the basis of the aforementioned finding.

First, an explanation will be made for the organic EL material comprising tris(8-quinolinolato)aluminum (Alq3) of this invention. This Alq3 generates heat of 2 J/g (Joule/gram) or less in the range of 350–400° C. and absorbs heat of 70–120 J/g in the range of 400–450° C. with the maximum of an endothermic peak being located near 420° C. on analysis by differential scanning calorimetry (amount of sample, 10 mg) in a stream of nitrogen. Although the conventional Alq3 for organic EL materials or unrefined Alq3 generates heat in the range of 350–400° C., Alq3 of this invention for an organic EL material is so prepared that it generates heat of 2 J/g or less and preferably shows no well-defined exothermic peak. What causes this heat generation is not known, but Alq3 of this invention was found to perform well when used as an organic EL material. The heat absorption in the range of 400–450° C. with the maximum of the endothermic peak being located near 420° C. is due to a composite of heat of fusion, heat of decomposition, heat of evaporation and heat of phase change and there should preferably be only one isolated endothermic peak near this point. How this affects the performance as an organic EL material is not clear, but it is conceivable that external factors such as decomposition of the material during fabrication of the device (by vapor deposition in vacuum at high temperature), behavior of impurities and deterioration of the performance caused by the contact with the hole transporting material affect the performance of devices and they are related to the endothermic peaks observed in differential thermal analysis.

It is preferable that Alq3 of this invention shows no peak at 418±2 cm$^{-1}$ and a peak at 423±2 cm$^{-1}$ in the infrared absorption spectrum measured by FT-IR spectrometry. The conventional Alq3 for organic EL materials or raw material Alq3 mostly shows a peak at 418±2 cm$^{-1}$ and no peak at 423±2 cm$^{-1}$. Alq3 of this invention satisfying the aforementioned condition was found to perform well as an organic EL material.

It would be sufficient if Alq3 of this invention satisfies the aforementioned requirements in respect to either differential scanning calorimetry or differential thermal analysis and FT-IR spectrometry, but a better-performing organic EL material would result if it satisfies both requirements simultaneously. Alq3 of this invention is such a one and fully satisfies the conditions required for organic EL materials in respect to formability into film, electron transporting property, luminous efficiency and luminance.

An explanation will then be made of the process of this invention for preparing Alq3. Raw material Alq3 is synthesized in accordance with one of the conventional processes without any difficulty. For example, the reaction of 8-hydroxyquinoline with a compound which is a source of aluminum in a suitable solvent readily gives Alq3; the source of aluminum is an inorganic aluminum compound such as aluminum sulfate and ammonium alum or an organoaluminum compound such as an aluminum alkoxide. Crude Alq3 prepared in this manner contains the unrecalled raw materials, impurities originating in the raw materials and imperfect coordination compounds. If water is used as a solvent in the reaction, it may coexist with the crude complex as water of crystallization. If an organic solvent is used, it may coexist with the crude complex as a ligand. The presence of water or the solvent can be detected easily by the aforementioned thermal analysis.

The raw material Alq3 thus prepared is then refined by sublimation. In the past, the raw material Alq3 was refined by repeating sublimation in a known glass apparatus without controlling the temperature in the recovery zone and used as an organic EL material. In this case, the number of repeated sublimation is generally said to be three. However, Alq3 refined in this manner was found to be insufficient in such basic properties as luminance and life when used as a luminescent material and/or an electron transporting material in an organic EL device.

The refining process of this invention performs sublimation of the raw material Alq3 at a reduced pressure of 10 Torr or less, preferably 3 Torr or less while keeping the temperature in the sublimation zone where the raw material sublimates above 300° C. and below 420° C. and the temperature in the principal zone of the product recovery zone where refined Alq3 is recovered as product or intermediate product above 100° C. and below 250° C. The temperature control conducted in this way is likely to contribute to separate efficiently the components differing delicately from one another in the rate of sublimation and the temperature of separation and give Alq3 of good quality useful for organic EL materials. As for the temperature in the sublimation zone, Alq3 decomposes at an accelerated rate with the concomitant drop in refining efficiency above 420° C. while the raw material Alq3 does not sublimate at a sufficiently high rate and the productivity drops markedly below 300° C. As for the temperature in the product recovery zone, the separation efficiency of Alq3 as product drops above 250° C. while a product of good properties is not obtained below 100° C. The latter situation is likely to arise as impurities separate out together with the product Alq3 if the temperature in the recovery zone is too low. Strictly speaking, the temperatures in the sublimation zone and the product recovery zone are related to vapor pressure and they vary with the pressure. At a pressure of 3 Torr or less, it is preferable to keep the temperature in the raw material sublimation zone above 300° C. and below 415° C. and that in the product recovery zone above 100° C. and below 200° C. Thus, lowering the pressure allows lowering the temperature in both the raw material sublimation zone and the product recovery zone and this is advantageous in that the thermal degradation of both the raw material and the product can be suppressed. The zone that is referred to as the product recovery zone in this invention is where refined Alq3 is separated and recovered as product (which includes the intermediate refined product here and hereafter). The principal zone refers to the whole or the major portion of the product recovery zone and this is where the whole or most of the product is recovered. It is not necessary to recover all of Alq3 separated in the principal zone as product and in case Alq3 separating in the terminal portion of the principal zone exhibits insufficient quality, a part of such Alq3 may not be recovered as product.

In practicing the refining process of this invention, it is desirable that the apparatus for purifying by sublimation has the sublimation zone and the recovery zone and the temperature in the principal zone where refined Alq3 separates is controlled within ±10° C., preferably ±5° C., more preferably ±2° C., of the set temperature. Since the temperature in the sublimation zone is close to the decomposition temperature of Alq3, the temperature here is desirably controlled as rigidly as possible within ±10° C., preferably ±5° C., more preferably ±2° C., of the set temperature. That is, the refining apparatus desirably has the sublimation zone, the recovery zone and a vacuum apparatus so arranged that the raw material sublimates on heating in the sublimation zone and successively separates out in the recovery zone and the gas containing the unseparated substances flows to the vacuum apparatus while the temperature continues to drop downstream. The recovery zone desirably has a certain width in the direction of flow and is provided with at least one zone, preferably plural zones, where the temperature is maintained at a constant level; said zone in which the temperature is set at a certain level within the aforementioned temperature range for the product recovery zone is made to serve as the principal zone where refined Alq3 separates and this temperature is desirably controlled within ±10° C. of the set temperature. It is possible to maintain a zone of a certain width at a given temperature by constructing the recovery zone in a cylindrical form and providing at least one zone where the temperature is kept roughly constant and another zone where the temperature is made to drop stepwise or in a slope; this arrangement makes it possible to separate stepwise Alq3 of different purity and EL characteristics and the impurities. For example, it is advantageous to provide a principal zone where refined Alq3 separates as product and to provide thereafter another zone where the temperature is set at a lower level than in the principal zone; the length (area) of the zone is suitably on the order of 10–100 cm although it varies with the size of the apparatus and the temperature inside the principal zone where refined Alq3 separates is desirably controlled within ±10° C., preferably ±5° C., more preferably ±2° C., of the set temperature. Rigid control of the temperature such as this contributes to make the quality of refined Alq3 separating out in the zone as uniform as possible and render substantially all of the separated refined Alq3 acceptable as product. The aforementioned set temperature varies with the degree of vacuum and it is properly 150° C. or so in case the pressure is 2 Torr or so. The recovery zone may be divided into plural zones of different temperature and individual control of the temperature in each zone can selectively separate a specific substance or composition.

The material of the apparatus for refining by sublimation may be glass or metal, but the latter is preferable as it allows rapid heating, lessens local overheating and withstands a high degree of vacuum. In particular, the sublimation zone and the principal zone of the product recovery zone are preferably made of metal. In this case, metal such as iron may be used on the outside and metal such as stainless steel and aluminum or a ceramic material such as Pyrex, quartz glass and alumina may be used on the inside. The sublimation zone is preferably so designed that its temperature can be set freely at any point up to 420° C. or more and it is heated by a known method, electrically by resistance heat or induction heat or indirectly by a heat transfer medium; in heating the sublimation zone and the principal zone of the product recovery zone that should desirably be kept stably at the set temperature, it is advantageous to provide a jacket on the outside and let a heat transfer medium of constant temperature flow through the jacket for indirect heating or to apply electrical heating such as resistance heating and induction heating. The zone that is provided with the jacket is kept at nearly constant temperature in this manner; hence, it is possible to change freely the width and location of a given zone by suitably positioning the jacket or the electrical heating device. Control of the set temperature of such zone is effected by controlling the temperature of a heat transfer medium or the supply of electric power. In carrying out sublimation, the temperature is set the highest where refined Alq3 is collected as product, at an increasingly lower level downstream and at roughly room temperature in the terminal collecting zone which is connected to the vacuum line. Those components which contaminate the refined product such as impurities in the raw material Alq3 and impurities generated by decomposition of Alq3 are collected at sites of different temperature in the recovery zone according to the vapor pressure, boiling point and solidifying point.

Application of such a procedure as described above for collecting at specified temperature to the apparatus for refining by sublimation can improve the quality of the refined product compared with the product conventionally refined by sublimation and, in turn, it can improve the performance of refined Alq3 as an organic EL material. Alq3 obtained by the refining process of this invention satisfies the aforementioned characteristic values of differential scanning calorimetry or FT-IR spectrometry in most cases. In case these values are not satisfied, a remedial measure is to increase the number of steps in the collecting zone and lessen the temperature gradient in each step or to repeat refining by sublimation. Moreover, Alq3 obtained by the refining process of this invention performs better as an organic EL material than Alq3 obtained by the conventional process and it is not always necessary for Alq3 refined by the process of this invention to satisfy the aforementioned characteristic values of differential scanning calorimetry or FT-IR spectrometry.

PREFERRED EMBODIMENTS OF THE INVENTION

Figure 1:
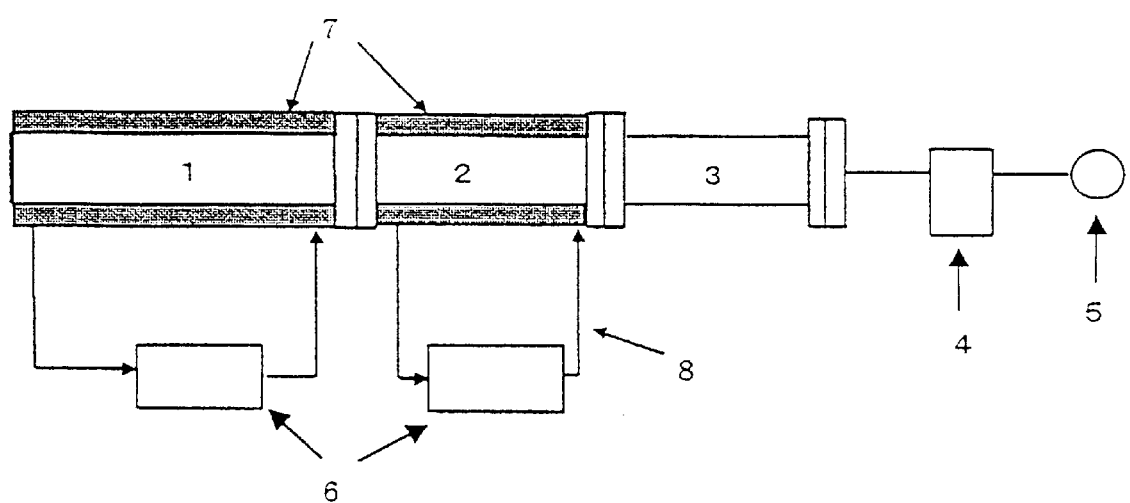
FIG. 1 illustrates schematically an apparatus made of metal for refining by sublimation.

A preferred example of the apparatus for refining by sublimation will be described with reference to FIG. 1. In this schematic drawing, the symbols designate the following; 1, a sublimation zone; 2, a product recovery zone of a recovery zone; 3, the second zone of a recovery zone; 4, a trap; 5, a vacuum pump; 6, an apparatus for heating and circulating a heat transfer medium; 7, a jacket; 8, a passage for a heat transfer medium. The sublimation zone 1 and the product recovery zone 2 are constructed of metallic cylinders and heated or cooled by a heat transfer medium which is supplied in circulation via the passage 8 for a heat transfer medium to the jacket 7 while the temperature in each zone is controlled independently. It is possible to maintain the temperatures of the sublimation zone 1 and the product recovery zone 2 encircled by the jacket 7 at the specified set temperature and hold the temperature difference inside the zone within the specified range by rigidly controlling the temperature of the apparatus 6 for heating and circulating a heat transfer medium and supplying a heat transfer medium in a sufficient amount. Out of the stream containing the sublimated raw material, refined Alq3 acceptable as product separates in the product recovery zone 2, Alq3 of poor quality for use as an EL material and the impurities separate in the second zone 3, powder and the like which remain unseparated in the preceding zones are separated in the trap 4 and the gaseous matters are drawn into the vacuum pump 5 and discharged.

An EL device of such a construction as glass substrate/ transparent electrode/hole injecting layer/hole transporting layer/luminescent layer/electron transporting layer/electrode is useful and it is allowable to omit some of the layers such as the hole injecting layer and the electron transporting layer. The organic EL material of this invention is suitable for use in the luminescent layer and/or the electron transporting layer. A preferred example of the EL device is explained with reference to FIG. 10.

This figure illustrates a device with a construction of glass substrate/ITO/TPD/Alq3/Al.Li and the symbols in the figure designate the following: 11, a glass substrate; 12, an ITO electrode; 13, a hole transporting layer (TPD); 14, a luminescent layer in which Alq3 is incorporated; 15, an Al.Li electrode; 16, an electric power source. The organic EL material of this invention can be used in the usual manner or used together with another organic EL material such as a dopant.

This invention will be described below with reference to the examples, but will not be limited thereto.

Analysis by differential scanning calorimetry in a stream of nitrogen specified by this invention was made with the use of a thermal analyzer manufactured by Seiko Instruments Inc. (differential scanning calorimeter Model DSC220 of SSC/5200, calibrated by indium and tin). This is adopted as the standard method of analysis. The measured values sometimes vary with the method of calibration of the apparatus in DSC analysis and it is to be noted that the numerical values obtained by the aforementioned standard method of analysis are taken as the temperature of exothermic and endothermic peaks and their calorific values of this invention.

EXAMPLE 1

To 93 g of water were added 25 g of aluminum sulfate hexadecahydrate and 35 g of 99% pure 8-hydroxyquinoline and the mixture was neutralized by dropwise addition of 29 g of a 33% solution of sodium hydroxide with stirring and allowed to react. The solid formed was collected by filtration, washed with water and dried to give 36 g of Alq3.

The raw material Alq3 (20 g) thus obtained was refined by sublimation with the use of the apparatus illustrated in FIG. 1. The sublimation zone 1 and the product recovery zone 2 are constructed of a metallic cylinder and each zone is heated or cooled by a heat transfer medium and the temperature of each zone is controlled independently. The second zone 3 was cooled by air. The system was evacuated to 2 Torr by the vacuum pump 5 and the raw material was sublimated for 3 hours to collect a solid substance on the inner surface of the recovery zone while maintaining the temperature in the sublimation zone 1 at 400° C., the temperature of the inner wall of the product recovery zone 2 at the set temperature of 150° C. and the difference in temperature between the inlet and outlet of the heat transfer medium within 2° C. The sublimation zone is approximately 500 ml in inner volume while the product recovery zone 2 is approximately 500 ml in inner volume and 30 cm in length and refined Alq3 collected in the product recovery zone 2 weighed 14 g.

Comparative Example 1

At the bottom of a 300-ml cylindrical round-bottomed flask was placed 5 g of the raw material Alq3 prepared as in Example 1 from aluminum sulfate and 8-hydroxyquinoline and to the flask was attached a cover fitted with a water-cooled condenser. The flask was then evacuated to 2 Torr and heated at 400° C. for 3 hours thereby sublimating the raw material Alq3 and collecting the product on the surface of the condenser. Alq3 thus collected was introduced to the bottom of the flask and sublimated again under the same conditions and sublimation was repeated three times in all to give 1.5 g of refined Alq3.

Figure 2:
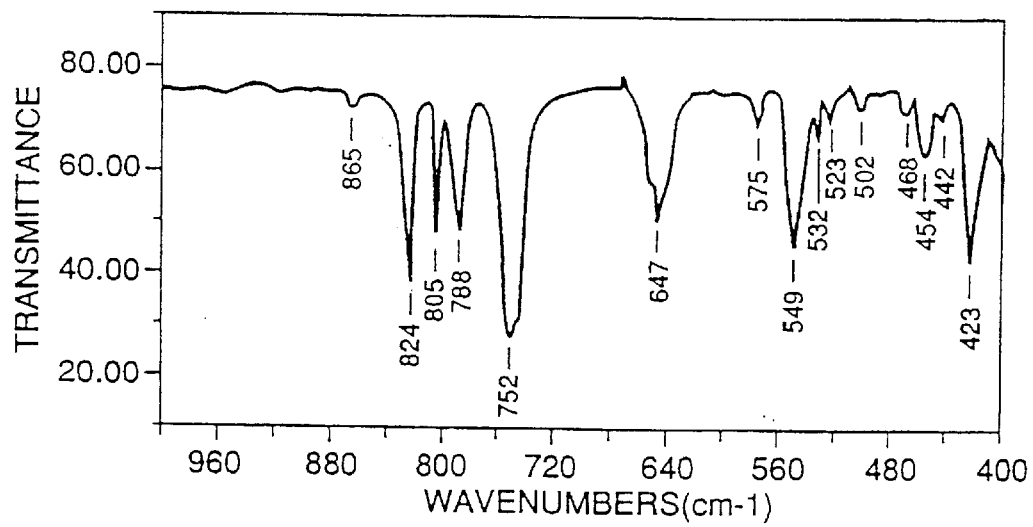
FIG. 2 is the FT-IR spectrum obtained in Example 1.
Figure 3:
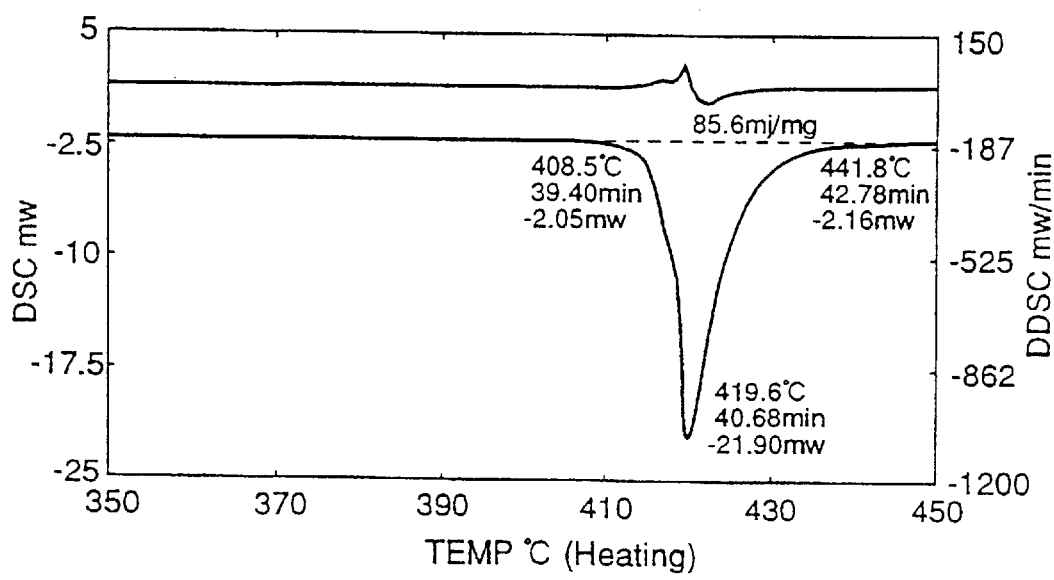
FIG. 3 is the DSC curve obtained in Example 1.
Figure 4:
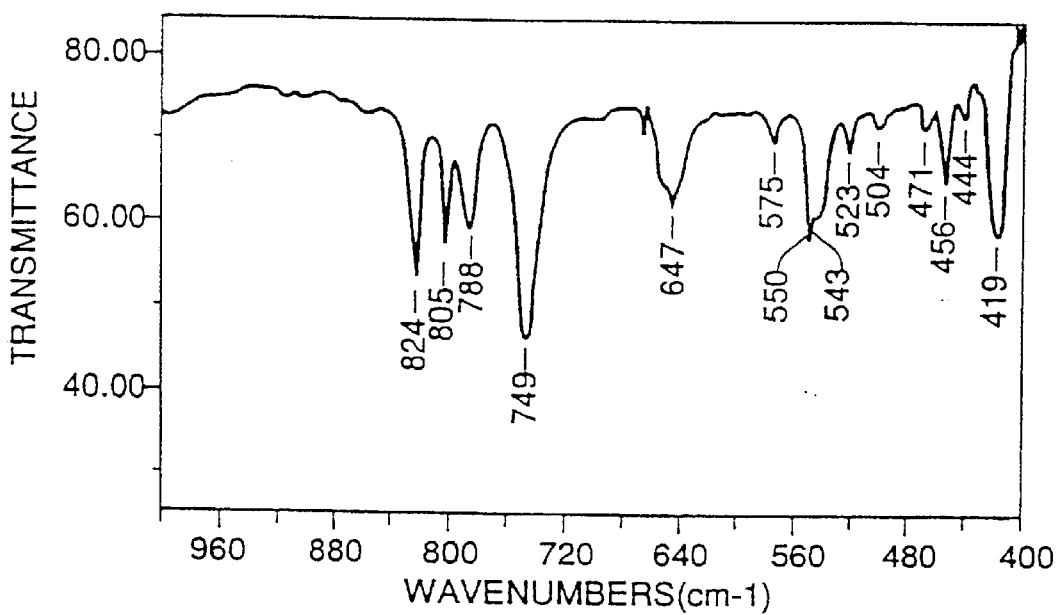
FIGS. 4 and 5 are respectively the FI-IR spectrum and the DSC curve obtained in Comparative Example 1.
Figure 5:
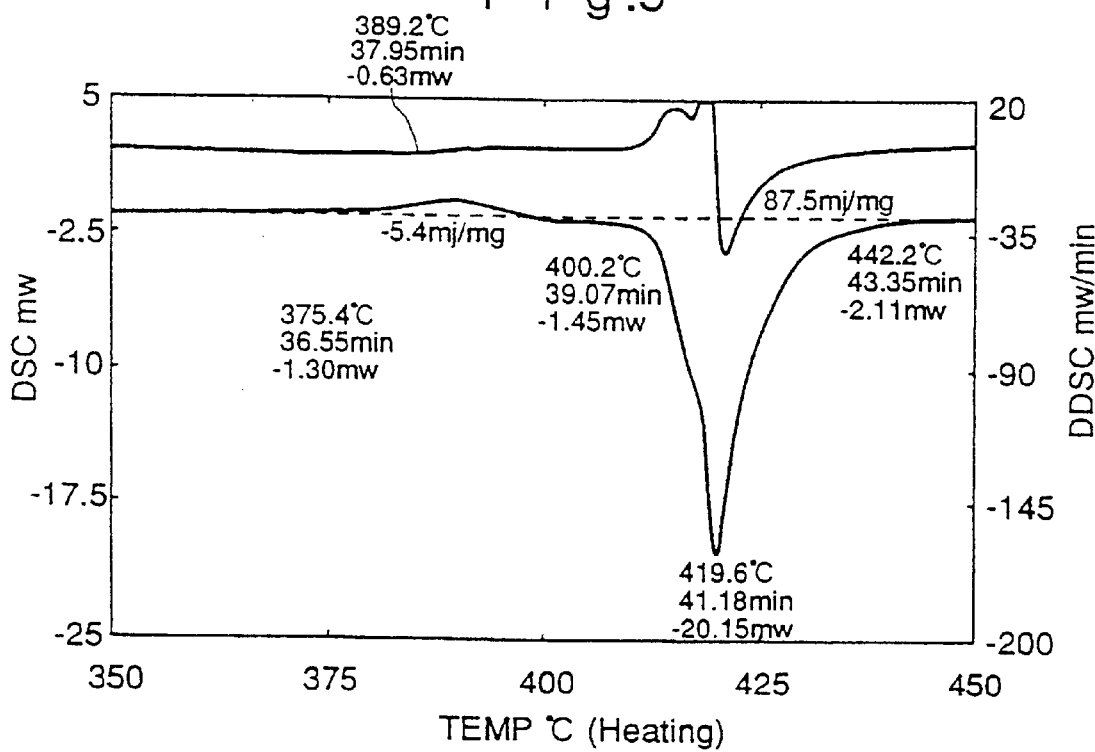

The analysis of the aforementioned refined Alq3 collected in the product recovery zone in Example 1 and Comparative Example 1 indicated no difference between the two in UV and fluorescence spectrometry and both were confirmed to be Alq3 on the basis of mass and $^1$H-NMR spectrometry. On the other hand, differences were observed between the two in FT-IR spectrometry and DSC analysis and the FT-IR spectra and DSC curves are shown in FIGS. 2–5. FIG. 2 is the FT-IR spectrum of Alq3 in Example 1 and shows a peak at 422 cm$^{-1}$ and no peak at 418±2 cm$^{-1}$, whereas FIG. 4 is the FT-IR spectrum of Alq3 in Comparative Example 1 and shows a peak at 419 cm$^{-1}$ and no peak at 423±2 cm$^{-1}$. FIG. 3 is the DSC curve of Alq3 in Example 1 and shows no exothermic peak in the range of 350–400° C. and an endothermic peak of 85.6 J/g with the maximum of the endothermic peak being located at 419.5° C., whereas FIG. 5 is the DSC curve of Alq3 in Comparative Example 1 and shows both exothermic peaks, one of 5.4 J/g with the maximum of the endothermic peak being located at 389.2° C. and another of 87.5 J/g with the maximum of the endothermic peak being located at 419.6° C.

EXAMPLE 2

As in Example 1, 22.7 g of ammonium alum and 21.8 g of 8-hydroxyquinoline were added to 150 g of water and the mixture was neutralized by dropwise addition of 6.5 g of a 33% solution of sodium hydroxide with stirring and allowed to react. The solid formed was washed with water and dried to give 21 g of Alq3. The raw material Alq3 thus prepared was refined in the metallic apparatus for refining by sublimation illustrated in FIG. 1 to give 11 g of refined Alq3.

Figure 6:
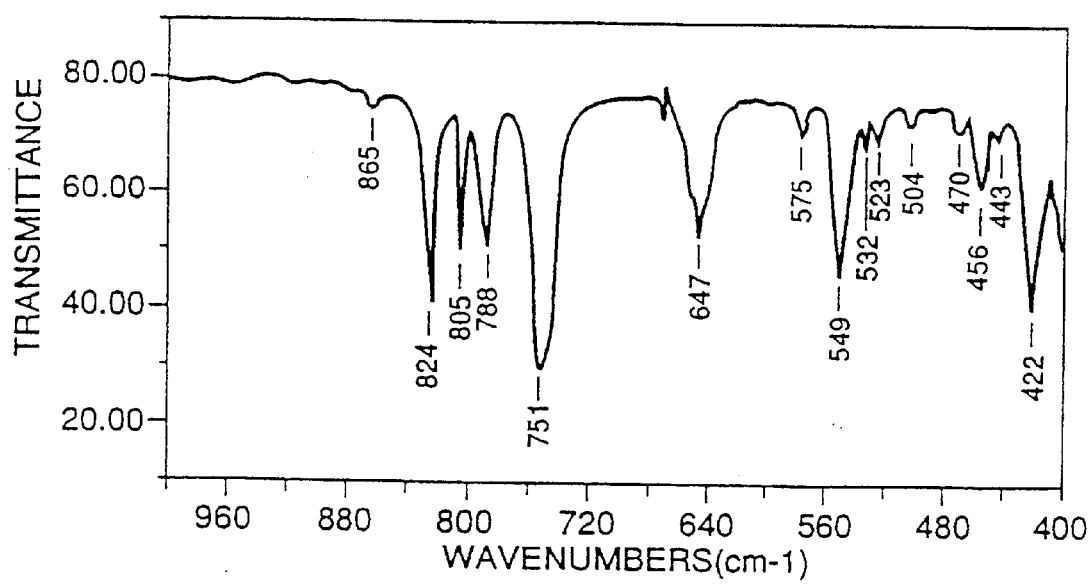
FIGS. 6 and 7 are respectively the FI-IR spectrum and the DSC curve obtained in Example 2.
Figure 7:
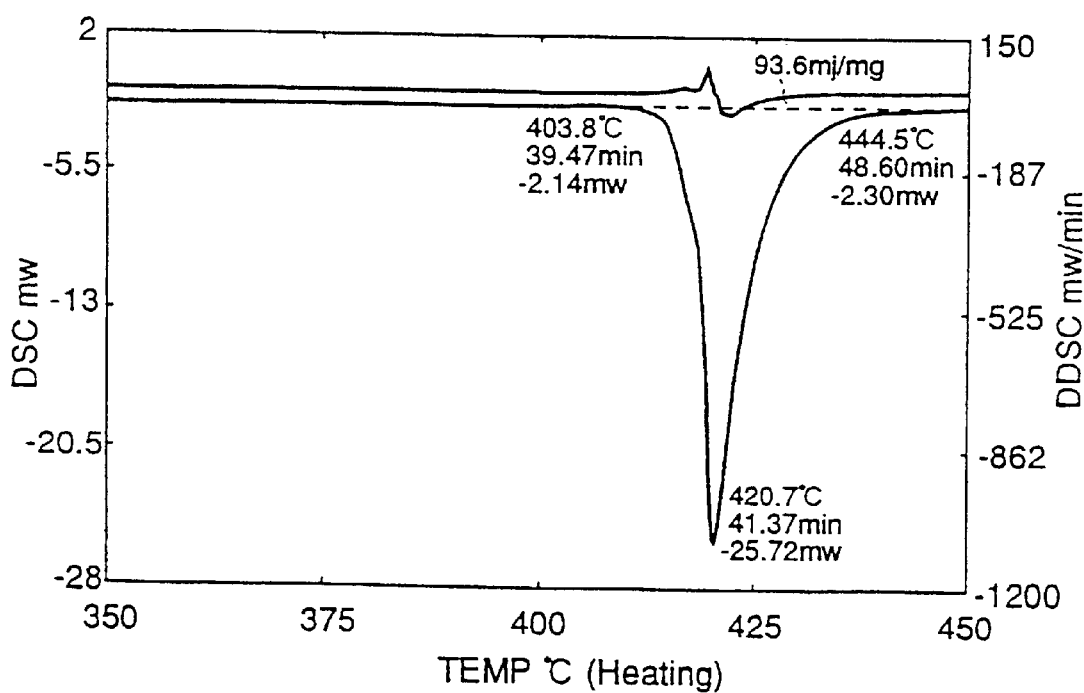
Figure 8:
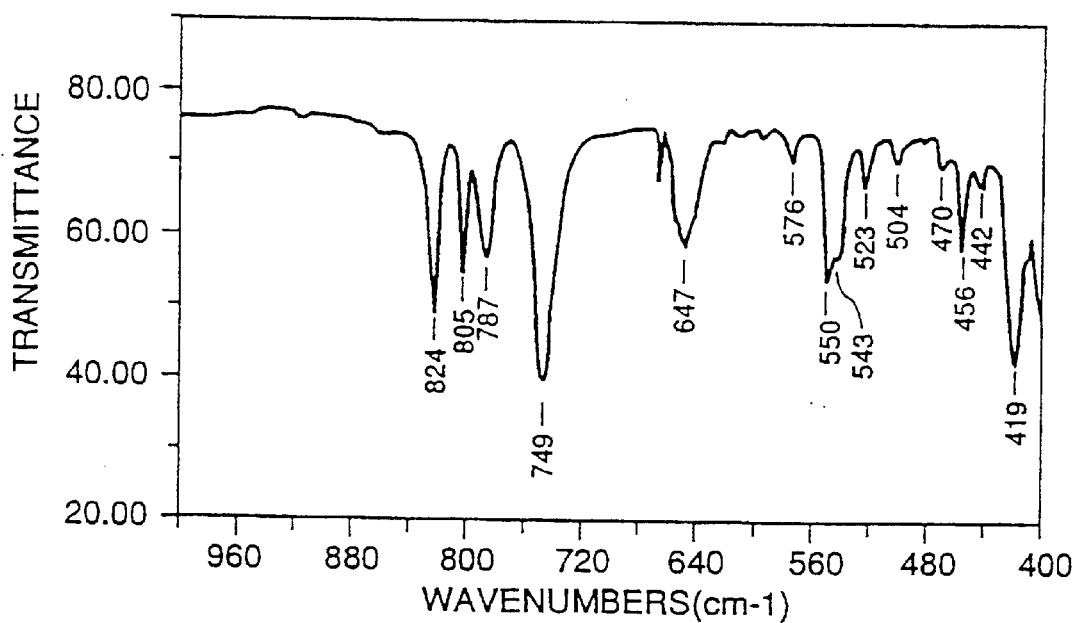
FIGS. 8 and 9 are respectively the FI-IR spectrum and the DSC curve obtained in Comparative Example 2.
Figure 9:
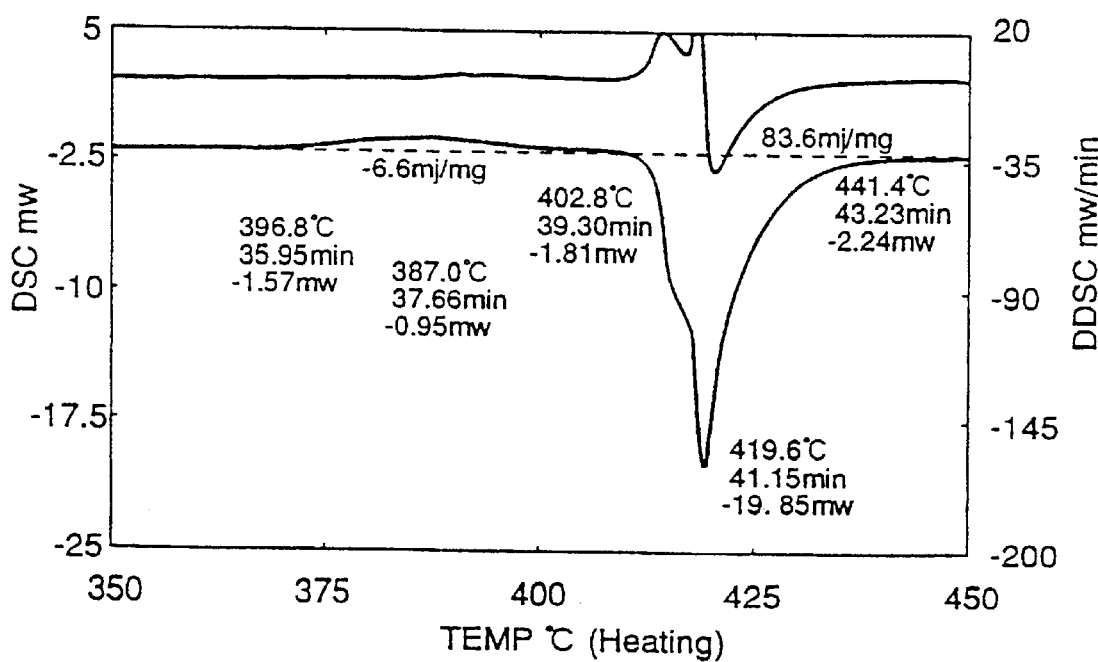

The raw material Alq3 prepared in Example 2 was refined by repeating sublimation three times in the same glass apparatus as in Comparative Example 1 to give 1.7 g of refined Alq3. The FT-IR spectra and DSC curves of refined Alq3 obtained in Example 2 and Comparative Example 2 are shown in FIGS. 6–9. FIG. 6 is the FT-IR spectrum of Alq3 obtained in Example 2 and shows a peak at 422 $cm^{-1}$ and no peak at 418±2 $cm^{-1}$, whereas FIG. 8 is the FT-IR spectrum of Alq3 obtained in Comparative Example 2 and shows a peak at 419 $cm^{-1}$ and no peak at 423±2 $cm^{-1}$. FIG. 7 is the DSC curve of Alq3 obtained in Example 2 and shows no exothermic peak in the range of 350–400° C. and an endothermic peak of 93.6 J/g with the maximum of the endothermic peak being located at 420.9° C., whereas FIG. 9 is the DSC curve of Alq3 obtained in Comparative Example 2 and shows both exothermic peaks, one of 6.6 J/g with the maximum of the endothermic peak being located at 387.0° C. and another of 83.6 J/g with the maximum of the endothermic peak being located at 419.6° C.

EXAMPLE 3

The raw material Alq3 was prepared as in Example 1, 10 g of the raw material was introduced to the same metallic apparatus for refining by sublimation as in Example 1 and the refining experiment was repeated 10 times at 2 Torr for 3 hours while keeping the temperature in the sublimation zone at 380° C. and that in the product recovery zone at the set temperature of 150° C. The results of DSC analysis (amount of sample, approximately 10 mg) of the refined product are shown in Table 1. None of the samples showed a well-defined exothermic peak in the range of 350–400° C. and each showed an endothermic peak of 85–97 J/g with the maximum of the endothermic peak being located near 420° C.

TABLE 1

| | DSC analysis | |
|---|---|---|
| No. | Peak temperature ° C. | Calorific value J/g |
| 1 | 418 | 92 |
| 2 | 421 | 89.6 |
| 3 | 421 | 93.6 |
| 4 | 421 | 91 |
| 5 | 419 | 88.1 |
| 6 | 421 | 89.9 |
| 7 | 421 | 90.8 |
| 8 | 420 | 85.7 |
| 9 | 420 | 85.6 |
| 10 | 421 | 96.3 |
| Average | 420 | 90.3 |

EXAMPLE 4

Experiments were conducted as in Example 1 while changing the temperature in the sublimation zone, the set temperature in the product recovery zone and the pressure. The experimental conditions and the results are shown in Table 2. Experiments 1–4 were conducted under the conditions specified by the process of this invention while Experiments 5–8 provide comparative examples. Slight generation of heat is observed in DSC in Experiments 1, 2 and 4 because the temperature in the sublimation zone, the temperature in the product recovery zone or the time is set somewhat higher or longer. Experiment 3 shows no generation of heat in DSC but the yield is somewhat low. The sublimation in Experiment 5 was carried out at a higher temperature and gives lower yield because the raw material partially decomposed into pitch. In Experiments 6 and 7, the raw material does not sublimate due to either low temperature or high pressure. Experiment 8 was conducted while keeping the temperature in the product recovery zone at a higher level and the $^{27}$Al-NMR analysis of the product recovered here indicates that the product is contaminated with 30% or so of the complex whose coordination number of Al has presumably changed from 6 to 5.

TABLE 2

| | | Temperature, ° C. | | | | DSC peak, J/g | | IR |
|---|---|---|---|---|---|---|---|---|
| No. | Pressure Torr | sublimation | product recovery | Time hr | Yield % | 350–400° C. | approx. 420° C. | peak $cm^{-1}$ |
| 1 | 2 | 400 | 200 | 3 | 70 | 0.5 | 94.4 | 424 |
| 2 | 2 | 400 | 200 | 1 | 65 | 1.6 | 91.1 | 423 |
| 3 | 4 | 360 | 100 | 5 | 55 | 0.0 | 91.5 | 422 |
| 4 | 2 | 340 | 150 | 20 | 52 | 0.4 | 88.2 | 422 |
| 5 | 10 | 430 | 200 | 4 | 10 | — | — | — |
| 6 | 2 | 280 | 150 | 20 | 0 | — | — | — |
| 7 | 15 | 415 | 150 | 5 | 0 | — | — | — |
| 8 | 3 | 400 | 270 | 3 | 70 | 0.2 | 87.0 | 425 |

EXAMPLE 5

The raw material Alq3 was prepared as in Example 1, 100 g of the raw material was introduced to the same metallic apparatus for refining by sublimation as in Example 1 and the refining experiment was repeated 3 times at 1.5 Torr for 3 hours while keeping the temperature in the sublimation zone at 400° C. and that in the product recovery zone at the set temperature of 180° C. The results of DSC analysis (amount of sample, approximately 10 mg) of the refined product are shown in Table 3.

In addition to the measurement in the standard DSC apparatus, the DSC apparatus was calibrated at three points by tin, indium and zinc and used for the analysis. In this case, the absorption of heat was somewhat greater than that obtained by the standard method in the standard DSC apparatus. With the use of either apparatus, no exothermic peak was confirmed in the range of 350–400° C. and an endothermic peak of 90–120 J/g was observed with the maximum of the endothermic peak being located near 420° C., although the numerical values of peak temperature and endothermic calorific value change more or less.

TABLE 3

| | DSC analysis | | |
|---|---|---|---|
| | Three-point calibration | | Standard method |
| No. | Peak temperature ° C. | Calorific value J/g | Calorific value J/g |
| 1 | 418.4 | 106.1 | 92.0 |
| 2 | 417.7 | 106.2 | 94.2 |
| 3 | 419.5 | 109.6 | 95 |

EXAMPLE 6

Figure 10:
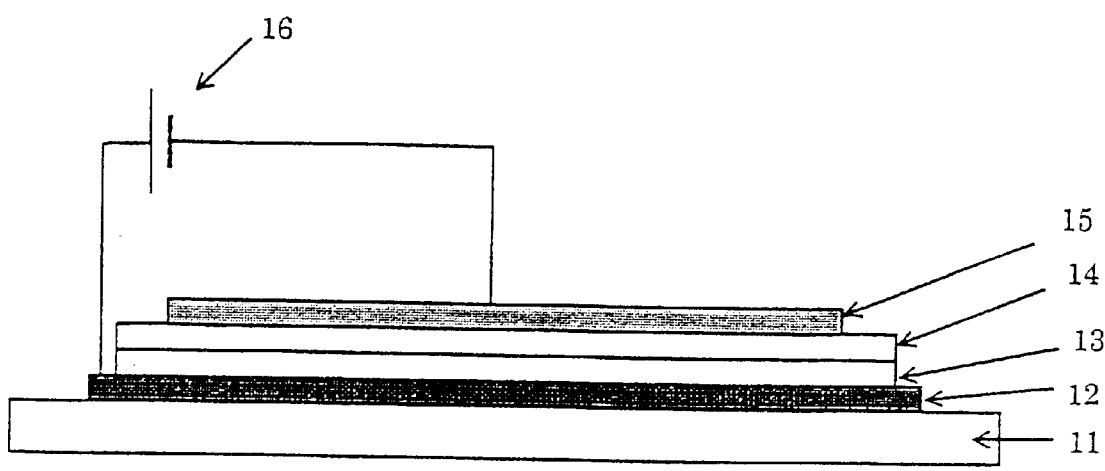
FIG. 10 is a cross-sectional view of the construction of an organic EL device.
Figure 11:
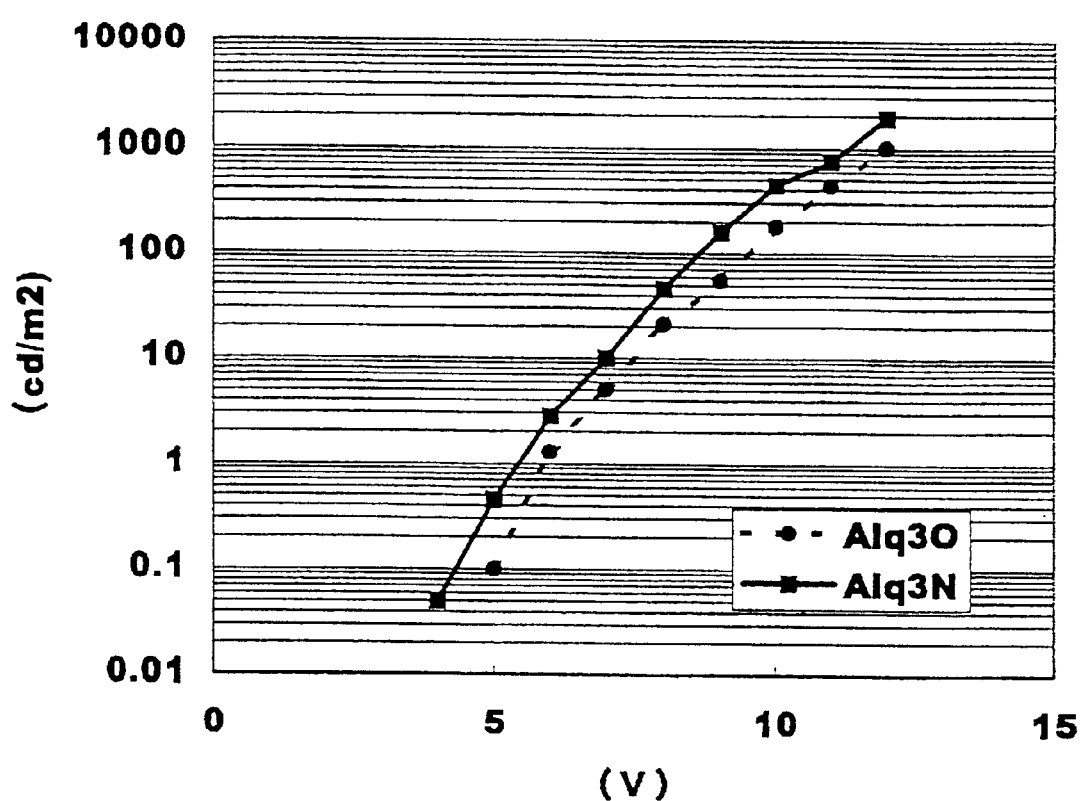
FIG. 11 shows plots of luminance against voltage for the experimental organic EL devices.

EL devices having the construction of glass substrate/ITO/ TPD/Alq3/Al.Li illustrated in FIG. 10 were prepared with the use of refined Alq3 obtained in Example 1 and Comparative Example 1 and their performance was compared. The results are shown in FIG. 11 in which the solid line refers to refined Alq3 of Example 1 (Alq3N) and the dotted line to that of Comparative Example 1 (Alq30); the 10-V luminance is 437 cd/m$^2$ for the former and 179 cd/m$^2$ for the latter respectively.

Similar comparative experiments were carried out for refined Alq3 of Example 2 and refined Alq3 of Comparative Example 2; the 10-V luminance was 480 cd/m$^2$ for the former and 200 cd/m$^2$ for the latter.

INDUSTRIAL APPLICABILITY

The organic EL material of this invention provides an El device with good basic characteristics in respect to luminance, efficiency and life and is useful for an organic EL device. The refining process of this invention can raise the purity of the raw material Alq3 to a high level in high yield in a compact apparatus while suppressing:the decomposition of Alq3 and it is economical.

What is claimed is:

1. An organic EL material comprising tris (8-quinolinolato)aluminum which is characterized by generating heat of 2 J/g or less in the range of 350–400° C. and absorbing heat of 70–120 J/g in the range of 400–450° C. with the maximum of an endothermic peak being located near 420° C. on analysis by differential scanning calorimetry in a stream of nitrogen.

2. The organic EL material as described in claim 1 wherein tris(8-quinolinolato)aluminum shows no peak at 418±2 cm$^{-1}$ and a peak at 423±2 cm$^{-1}$ in the infrared absorption spectrum measured by FT-IR spectrometry.

3. A process for refining tris(8-quinolinolato)aluminum for use in an organic EL material which comprises refining the raw material tris(8-quinolinolato)aluminum by sublimation under reduced pressure of 10 Torr or less while maintaining the temperature in the sublimation zone above 300° C. and below 420° C. and the temperature in the principal zone of the product recovery zone above 100° C. and below 250° C.

4. The process for refining tris(8-quinolinolato)aluminum for use in an organic EL material as described in claim 3 wherein the apparatus for refining by sublimation comprises the sublimation zone and the recovery zone including the product recovery zone and the temperature in the principal zone of the product recovery zone is controlled within ±10° C. of the set temperature.

5. In an organic EL device comprising layers at least having glass substrate/transparent electrode/hole transporting layer/luminescent layer/electrode, an organic EL device wherein tris(8-quinolinolato)aluminum to be incorporated in the luminescent layer is the organic EL material described in claim 1.

6. In an organic EL device comprising layers at least having glass substrate/transparent electrode/hole injecting layer/hole transporting layer/luminescent layer/electron transporting layer/electrode, an organic EL device wherein tris(8-quinolinolato)aluminum to be incorporated in the electron transporting layer is the organic EL material described in claim 1.

7. In an organic EL device comprising layers at least having glass substrate/transparent electrode/hole transporting layer/luminescent layer/electrode, an organic EL device wherein tris(8-quinolinolato)aluminum to be incorporated in the luminescent layer is the one refined in accordance with the process for refining tris(8-quinolinolato)aluminum for use in an organic EL device described in claim 4.

8. In an organic EL device comprising layers at least having glass substrate/transparent electrode/hole transporting layer/luminescent layer/electron transporting layer/ electrode, an organic EL device wherein tris(8-quinolinolato)aluminum to be incorporated in the electron transporting layer is the one refined in accordance with the process for refining tris(8-quinolinolato)aluminum for use in an organic EL device described in claim 4.

* * * * *